United States Patent [19]

Mateika et al.

[11] 4,454,206

[45] Jun. 12, 1984

[54] MAGNETIC DEVICE HAVING A MONOCRYSTALLINE GARNET SUBSTRATE BEARING A MAGNETIC LAYER

[75] Inventors: Dieter Mateika, Ellerbek; Rolf Laurien, Pinneberg, both of Fed. Rep. of Germany

[73] Assignee: U.S. Philips Corporation, New York, N.Y.

[21] Appl. No.: 401,032

[22] Filed: Jul. 22, 1982

Related U.S. Application Data

[62] Division of Ser. No. 168,227, Jul. 14, 1980, Pat. No. 4,379,853.

[30] Foreign Application Priority Data

Jul. 12, 1979 [DE] Fed. Rep. of Germany ....... 2928176
Mar. 7, 1980 [DE] Fed. Rep. of Germany ....... 3008706

[51] Int. Cl.³ .................. G11B 5/64; C04B 35/50
[52] U.S. Cl. ................. 428/692; 156/DIG. 63; 252/62.57; 365/33; 428/693; 428/700; 428/900
[58] Field of Search ............... 428/900, 700, 692, 693, 428/694; 365/33; 423/593, 263; 252/62.59, 62.57; 156/DIG. 63; 427/127, 128; 501/86, 135, 152

[56] References Cited

U.S. PATENT DOCUMENTS

| | | | |
|---|---|---|---|
| 3,959,006 | 5/1976 | Herrnring | 156/DIG. 63 |
| 4,138,530 | 2/1979 | Breed | 428/692 |
| 4,165,410 | 8/1979 | Blank | 428/900 |
| 4,169,189 | 9/1979 | Stacey | 428/900 |
| 4,199,396 | 4/1980 | Brandle | 423/593 |
| 4,355,072 | 10/1982 | Mateika | 428/693 |

*Primary Examiner*—Ellis P. Robinson
*Attorney, Agent, or Firm*—Paul R. Miller

[57] ABSTRACT

Magnetic device having a monocrystalline substrate bearing a magnetic layer, said substrate having a composition on the basis of rare earth metal gallium garnet of the general formula $$A^{3+}_{3-x} B^{2+}_{x} Ga^{3+}_{5-x-2y} C^{2+}_{y} D^{4+}_{x+y} O_{12},$$

wherein
A = gadolinium and/or samarium and/or neodym and/or yttrium
B = calcium and/or strontium
C = magnesium
D = zirconium and/or tin and
$0 < x \leq 0.7$; $0 < y \leq 0.7$ and $x+y \leq 0.8$.

4 Claims, 2 Drawing Figures

MAGNETIC DEVICE HAVING A MONOCRYSTALLINE GARNET SUBSTRATE BEARING A MAGNETIC LAYER

This is a division of application Ser. No. 168,227, filed July 14, 1980, now U.S. Pat. No. 4,379,853.

The invention relates to a magnetic device having a monocrystalline rare-earth metal gallium garnet substrate bearing a monocrystalline magnetic layer of garnet material.

Single crystal garnets having a composition responding to the formula $$A_3^{3+}B_5^{3+}O_{12},$$

in particular gallium garnets, having lattice constants $a_o$ in the range from 1.230 nm to 1.250 nm are preferably used as substrates of, for example, 0.8 mm thickness for magnetic storage layers in magnetic bubble devices (a type of information storage which uses mobile magnetic cylindrical domains) (see IEEE Transactions Mag-7 (1971), p. 404).

Thin magnetic garnet layers (storage material) of a few μm thickness, for example 5 μm, are grown on said substrate crystals in known manner in a liquid phase of gaseous phase epitaxial process. Such garnet layers can grow on the relevant substrate with the required perfection only when substrate and epitaxial layer have substantially the same crystallographic lattice constant.

For information storage according to the thermomagnetic storage method while using the magneto-optical Faraday effect for reading the stored information (see J. Appl. Phys. 40 (1969), pp. 1429–1435), the Q-factor of the storage material, can be increased considerably when a sufficient quantity of bismuth is incorporated in the storage material, which produces an essential increase of the Faraday rotation (German Offenlegungsschrift No. 23 49 348). Since the incorporation of bismuth increases the lattice constant of the magnetic layer, a substrate with a matched lattice constant $a_0$ (approximately 1.249 nm) must be used in this case.

For this purpose so far use has been made of neodymgallium garnet ($Nd_3Ga_5O_{12}$) (ao = 1.250 nm) or related mixed crystals (German Offenlegungsschrift No. 24 34 251).

Such single crystals are usually grown as long rods from a melt, for example, according to a method described in "Solid State Communications" 2 (1964), pp. 229-231. Discs of the desired thickness are then cut from said non-magnetic garnet rods to provide substrates for the deposition of magnetic garnet layers. The manufacture of magnetic garnet layers is described, for example, in the work by W. Tolksdorf in IEEE Trans. magn. Mag-11 (1975), p. 1074 et seq.

A match between the lattice constants of the substrate and that of the layer is required both to avoid stress cracks in the grown magnetic layer and also to adjust the magnetic properties. By the choice of a suitable rare earth gallium garnet ($SE_3Ga_5O_{12}$; SE=Y, Gd, Sm, Nd), a rough adaptation of the lattice constants is achieved which, however, has proved to be insufficient in practice.

German Offenlegungsschrift No. 24 34 251 discloses a substrate crystal on the basis of rare earth metal-Ga-garnet of the general formula $$A_{3-x}^{3+}B_x^{2+}Ga_{5-x}^{3+}C_x^{4+}O_{12}$$

(A=Gd, Sm or Nd; B=Ca, Sr or Mg; C=Zr or Sn) in which an additional fine adaptation of the lattice constants is endeavoured by a partial replacement of the cations of the garnet lattice by foreign ions. $Ca^{2+}$ or $Sr^{2+}$ or $Mg^{2+}$ ions are substituted for rare earth metal ions in the dodecahedron lattice sites and $Zr^{4+}$ or $Sn^{4+}$ ions are substituted for gallium ions on the octahedron sites of the garnet lattice so that the lattice constant can be varied between 1.236 nm and 1.257 nm. A disadvantage of these known compositions is that it is difficult to grow crystals up to a diameter of 22 mm at a sufficient rate of growth of approximately 2 mm h$^{-1}$.

When a crystal is drawn from a melt of the above type of composition at too high a drawing rate, impurities can accumulate in front of the growth front which lead to a reduction of the melting point and hence to an increased local growth rate of the crystal. The crystal will not grow in equilibrium composition and tends to stresses and formation of disclocations.

In this connection the following explanation may be given.

For the technical use of the said mixed single crystals as a substrate it is of importance that during the growth the composition and hence the lattice constant $a_o$ of the crystal between the beginning and the end of the growth should be substantially equal, the deviation $\Delta a^o$ being not larger than $1.2 \times 10^{31} \propto nm$. This can be achieved only when the distribution coefficient $K_{eff}$ between crystal and melt is one or substantially one.

The determination of the distribution coefficient occurs by determining the crystal composition by means of X-ray fluorescence analysis. The value for $K_{eff}$ appears from the ratio of the concentrations of the individual components in the crystal to the concentrations of the individual components in the melt.

The invention is based on the recognition that in rare earth metal gallium garnets by coupled substitution of first a part of the rare earth metal ions by suitable alkaline earth metal ions such as $Ca^{2+}$ or $Sr^{2+}$, and secondly of a part of the gallium ions by suitable ions of bivalent elements such as $Mg^{2+}$ simultaneously with suitable ions of quadrivalent elements such as $Zr^{4+}$ or $Sn^{4+}$, the desired crystal properties can be achieved. Therefore the magnetic device referred to in the opening paragraph is characterized according to the invention in that the substrate has the composition $$A_{3-x}^{3+}B_x^{2+}Ga_{5-x-2y}^{3+}C_y^{2+}D_{x+y}^{4+}O_{12}.$$

The invention is moreover based on the recognition that by incorporation of $Ca^{2+}$ ions and/or $Sr^{2+}$ ions in addition to $Mg^{2+}$ and $Zr^{4+}$ and/or $Sn^{4+}$ ions in a gadolinium gallium garnet a variation is possible of the lattice constants with the distribution coefficient of substantially 1 remaining the same.

The advantages achieved by means of the invention are effective in particular in a large series manufacture. It is desirable, for example, to be able to manufacture displays having the largest possible area, which can be achieved only when the substrate crystals have a largest possible diameter and are substantially stress-free. Moreover, it is of importance that for economical reasons the growth rate of these crystals should be increased while an important advantage is that while growing with distribution coefficients $K_{eff}$ of substantially 1 crystal having a desired lattice constant $a_o$ of 1.2497 nm can be achieved, which ensures the adaptation of the substrate to a bismuth containing rare earth metal iron garnet layer to be grown.

The invention will now be described in greater detail with reference to a few examples.

In the drawing

Figure 1:
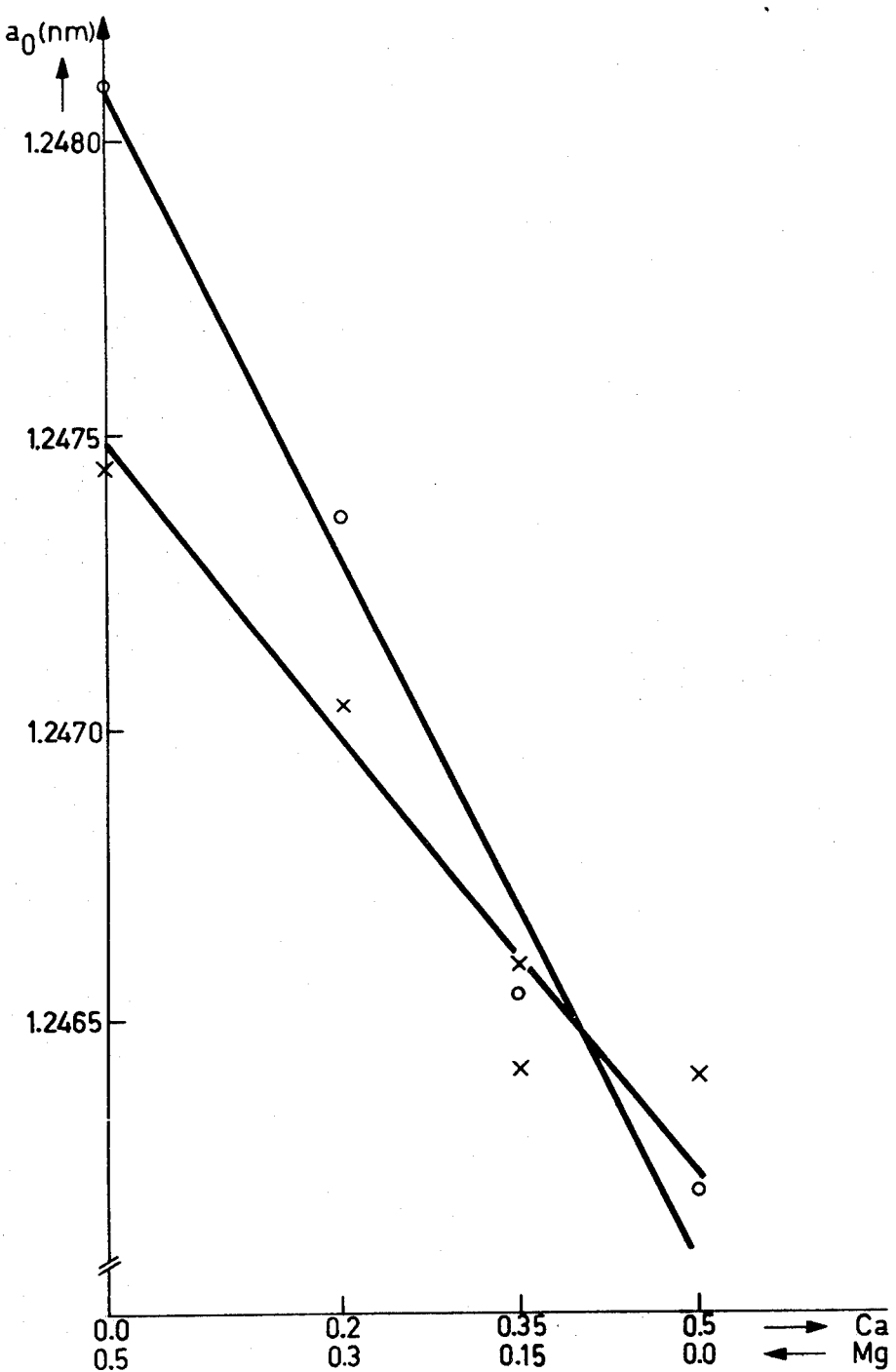
FIG. 1 is a graphic representation of the lattice constants of a series of mixed crystals according to the invention grown with constant Zr-content in the melt of 0.5 formula units as a function of the Ca and Mg contents, respectively, in the melt.

The crosses in FIG. 1 denote the lattice constants of the beginning (150 g of crystal weight) and the circles show the lattice constants of the end (450 g of crystal rate) of the cylindrical part of single crystals according to the invention grown with a constant Zr content in the melt of 0.5 formula units and respective contents of Mg and Ca in the melt (total weight of the starting substances 800 g). For a melt composition with a Ca content of ~0.4 formula units and an Mg content of ~0.1 formula units no change of the lattice constants is observed within the measuring accuracy. With this melt composition the influence of the distribution coefficients on the lattice constant is compensated.

Figure 2:
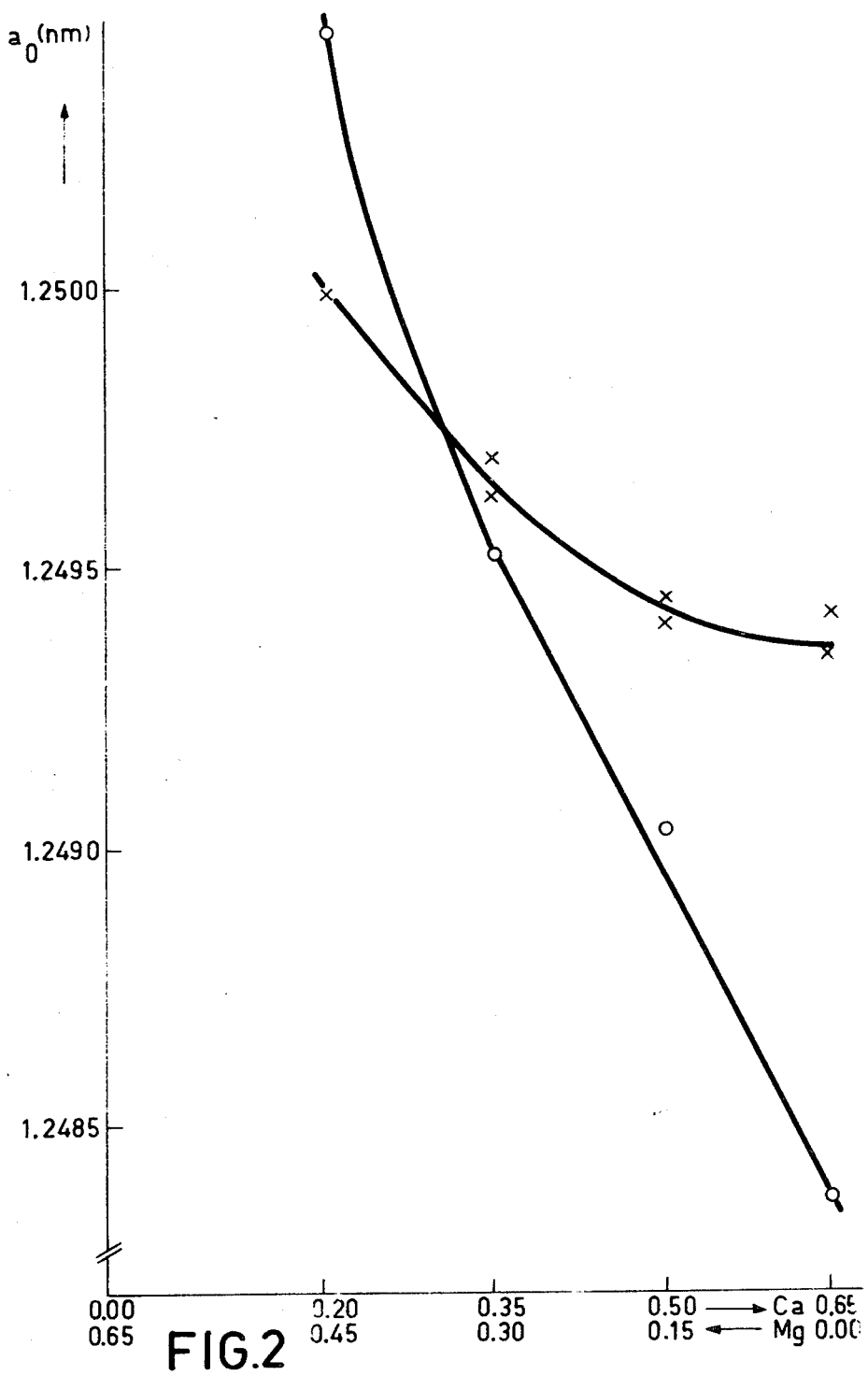
FIG. 2 is a graphic representation of the lattice constants of a series of mixed crystals according to the invention grown with a constant Zr content in the melt of 0.65 formula units as a function of the Ca and Mg contents, respectively, in the melt.

The crosses in FIG. 2 denote the lattice constants of the beginning (150 g of crystal weight) and the circles denote the lattice constants of the end (450 g of crystal weight) of the cylindrical part of single crystals according to the invention grown with a constant Zr content in the melt of 0.65 formula units and respective contents of Mg and Ca, respectively, in the melt (overall weight of the starting substances 800 g).

The optimum melt composition seems to lie for these mixed crystal series at a Ca content of ~0.35 formula units and at a Mg content of ~0.30 formula units.

The growth of these substrate crystals will be described hereinafter.

Described is the growth of a $Gd_{2.6}Ca_{0.4}Ga_{4.1}Mg_{0.25}Zr_{0.65}O_{12}$ mixed crystal;

The starting substances (1947.11 g of $Gd_2O_3$, 1587.65 g of $Ga_2O_3$, 92.68 g of CaO, 41.63 g of MgO and 330.93 g of $ZrO_2$, overall weight 4000 g) were mixed, compressed into the form of a cylinder and sintered in an oxygen atmosphere at 1500° C.

The sintered body is then melted in an inductively heated iridium crucible at approximately 1800° C. in a closed crystal drawing apparatus. A gas mixture consisting of 50% $N_2$ + 50% $Co_2$ is passed through the apparatus. A cylindrical monocrystalline rod of gadolinium-gallium garnet serves as a seed crystal. The drawing process is carried out in known manner according to the Czochralski method. The growth rate is 5.0 mm $h^{-1}$, the speed of rotation ~40 U min$^{-1}$. The grown crystals have a maximum length of 130 mm and a maximum diameter of 77 mm. Their lattice constant $a_o$ is 1.249 nm, in which the deviation $\Delta a_o$ of the value for the lattice constant between the beginning of the growth and the end of the growth was not more than $1.0 \times 10^{-4}$ nm.

In the same manner as described above, $Gd_{2.65}Ca_{0.35}Gd_{4.35}Mg_{0.15}Zr_{0.5}O_{12}$ mixed crystals and $Gd_{2.65}Ca_{0.35}Gd_{4.05}Mg_{0.3}Zr_{0.65}O_{12}$ mixed crystals were grown. Their lattice constants were 1.247 nm and 1.250 nm, respectively, in which the deviation $\Delta a_o$ of the value for the lattice constant between the beginning of the growth and the end of the growth in these cases also was not more than $1.10^{31\ 4}$ nm.

It is described above how a part of the rare earth metal ions was replaced by calcium ions and a part of the gallium ions was replaced by magnesium and zirconium ions. On the basis of very similar ion radii, however, other alkaline earth metal ions, for example strontium$^{2+}$, can be substituted instead of calcium ions and tin$^{4+}$ can be substituted instead of zirconium ions. The ion radii of the elements taking part in the above mixed crystals are stated hereinafter. The rare earth metal ions (ion radii each time indicated in brackets) $Gd^{3+}$ (0.106 nm), $Sm^{3+}$ (0.109 nm), $Nd^{3+}$ (0.112 nm) and $Y^{3+}$ (0.102 nm) were substituted partly by $Ca^{2+}$ (0.112 nm) or $Sr^{2+}$ (0.125 nm). The gallium ions $Ga^{3+}$ (0.062 nm) in the octahedron sites were substituted partly by $Mg^{2+}$ (0.072 nm) and by $Zr^{4+}$ (0.075 nm) or $Sn^{4+}$ (0.069 nm).

All grown crystals were optically transparent. The crystal perfection was investigated by means of a polarization microscope and according to the Schlieren method. Dislocations and inclusions were ascertained to $< cm^2$.

These single crystals are suitable in particular as a substrate for expitaxial magnetic garnet layers for magneto-optical information storage devices for displays.

For the deposition of magnetic layers non-magnetic substrate monocrystalline discs of the above-compositions are dipped in a liquid solution according to known methods (compare Appl. Phys. Lett. 19 (1971), pp 486–488, and Journal of Cryst. Growth 17 (1972), pp 322–328), in which garnet layers of, for example, the composition $(Gd, Bi)_3 (Fe, Al, Ga)_5O_{12}$ of approximately 5 μm thickness are grown by a liquid phase epitaxial process.

For writing information bits, the magnetic layers are scanned with a laser beam; in consequence of the resulting heating of the garnet layer the direction of the magnetization is switched locally under the action of a perpendicular external magnetic field. For reading the information state, the magneto-optical Faraday effect is used. This effect can also be made useful for optical display systems. For example, a garnet display of the projection type is known (see IEEE Transactions MAG-7 (1971) pp. 370-373) in which for increasing the image contrast a considerable substitution of, for example, one rare earth metal ion per formula unit by bismuth is effected which involves the already described problems and necessitates a substrate with increased lattice constant.

An advantage of large substrate discs is that the number of storage places per disc is increased. For certain applications, for example for reprography apparatus, a storage capacity of 256×128 bits is required for one storage matrix. This can be realized only when the substrate discs have a diameter of not smaller then 48 mm.

What is claimed is:

1. A magnetic device having a monocrystalline rare earth metal gallium garnet substrate bearing a monocrystalline magnetic layer of garnet material, characterized in that the substrate has the composition $$A^{3+}_{3-x} B^{2+}_x Ga^{3+}_{5-x-2y} C^{2+}_y D^{4+}_{x+y} O_{12},$$

in which
- A = gadolinium and/or samarium and/or neodym and/or yttrium
- B = calcium and/or strontium
- C = magnesium
- D = zirconium and/or tin $0 < x \leq 0.7; 0 < y \leq 0.7$ and $x+y \leq 0.8$.

2. A magnetic device as claimed in claim 1, characterized in that $0.1 \leq +, y \leq 0.4$ and $0.5 \leq x+y \leq 0.7$.

3. A magnetic device as claimed in claim 1 or 2, characterized in that the substrate has the composition $Gd_{2.65}Ca_{0.35}Ga_{4.05}Mg_{0.3}Zr_{0.65}O_{12}$.

4. A magnetic device as claimed in claims 1 or 2, characterized in that the substrate has the composition $Gd_{2.6}Ca_{0.4}Ga_{4.1}Mg_{0.25}Zr_{0.65}O_{12}$.

* * * * *

UNITED STATES PATENT AND TRADEMARK OFFICE
CERTIFICATE OF CORRECTION

PATENT NO. : 4,454,206
DATED : June 12, 1984
INVENTOR(S) : DIETER MATEIKA ET AL

It is certified that error appears in the above-identified patent and that said Letters Patent is hereby corrected as shown below:

Column 1, line 45, change "ao" to --$a_o$--;

Column 3, line 68, change

"$Gd_{2.65}Ca_{0.35}Gd_{4.35}Mg_{0.15}Zr_{0.5}O_{12}$" to

--$Gd_{2.65}Ca_{0.35}Ga_{4.35}Mg_{0.15}Zr_{0.5}O_{12}$--;

Column 4, line 1, change

"$Gd_{2.65}Ca_{0.35}Gd_{4.05}Mg_{0.3}Zr_{0.65}O_{12}$" to

--$Gd_{2.65}Ca_{0.35}Ga_{4.05}Mg_{0.3}Zr_{0.65}O_{12}$--;

Column 4, line 27, change "$<cm^2$" to --$<5 \times 10^{-2}$ per $cm^2$--;

Column 6, line 3, change "$0.1 \leq +$" to --$0.1 \leq x$--.

Signed and Sealed this

Ninth Day of April 1985

[SEAL]

Attest:

DONALD J. QUIGG

Attesting Officer   Acting Commissioner of Patents and Trademarks

UNITED STATES PATENT AND TRADEMARK OFFICE
CERTIFICATE OF CORRECTION

PATENT NO. : 4,454,206
DATED : June 12, 1984
INVENTOR(S) : DIETER MATEIKA ET AL

It is certified that error appears in the above-identified patent and that said Letters Patent is hereby corrected as shown below:

In the Abstract, last line change "O<x$\leq$0.7;O" to --0<x$\leq$0.7;0--.

In the Claims, column 6, line 1 change "O<X" to --0<x--.

Signed and Sealed this

Twenty-third Day of September 1986

[SEAL]

Attest:

DONALD J. QUIGG

Attesting Officer

Commissioner of Patents and Trademarks